(12) United States Patent
Lu

(10) Patent No.: US 10,305,211 B2
(45) Date of Patent: May 28, 2019

(54) CONNECTOR HAVING INCREASED CONTACT AREA FOR POWER TRANSMISSION AND RELATED POWER SUPPLY

(71) Applicant: 3Y POWER TECHNOLOGY (TAIWAN), INC., Taoyuan (TW)

(72) Inventor: Shao-Feng Lu, Taoyuan (TW)

(73) Assignee: 3Y POWER TECHNOLOGY (TAIWAN), INC., Taoyuan (TW)

( * ) Notice: Subject to any disclaimer, the term of this patent is extended or adjusted under 35 U.S.C. 154(b) by 0 days.

(21) Appl. No.: 15/805,143

(22) Filed: Nov. 7, 2017

(65) Prior Publication Data

US 2018/0159255 A1 Jun. 7, 2018

(30) Foreign Application Priority Data

Dec. 2, 2016 (CN) ..................... 2016 2 1330367 U

(51) Int. Cl.
| | |
|---|---|
| *H01R 12/72* | (2011.01) |
| *H01R 13/04* | (2006.01) |
| *H01R 12/70* | (2011.01) |
| *H01R 4/02* | (2006.01) |
| *H05K 1/02* | (2006.01) |
| *H05K 7/20* | (2006.01) |

(52) U.S. Cl.
CPC ............ *H01R 13/04* (2013.01); *H01R 4/029* (2013.01); *H01R 12/707* (2013.01); *H01R 12/7082* (2013.01); *H01R 12/7088* (2013.01); *H01R 12/724* (2013.01); *H05K 1/0201* (2013.01); *H05K 1/0203* (2013.01); *H05K 1/0209* (2013.01); *H05K 7/20* (2013.01); *H05K 7/20154* (2013.01)

(58) Field of Classification Search
CPC .............. H01R 12/724; H01R 23/7073; H05K 1/0201; H05K 1/0209; H05K 7/20; H05K 7/20154; H05K 1/0203
USPC .......................................... 439/79, 487, 485
See application file for complete search history.

(56) References Cited

U.S. PATENT DOCUMENTS

| | | | |
|---|---|---|---|
| 8,708,741 B2 * | 4/2014 | Tanaka ............... | H01R 43/0256 439/485 |
| 9,136,645 B1 * | 9/2015 | Yu ...................... | H01R 12/7088 |

(Continued)

*Primary Examiner* — Abdullah A Riyami
*Assistant Examiner* — Justin M Kratt
(74) *Attorney, Agent, or Firm* — Winston Hsu

(57) ABSTRACT

A connector is provided including an insulating body and a plurality of power terminal components. Each of the power terminal components includes a power terminal and an extension portion. The power terminal is inserted into the insulating body. The extension portion protrudes at a rear end of the power terminal in a projecting manner, wherein the extension portion protrudes out of the insulating body. During operation of the connector, current flows from the extension portion to the connector through the power terminal, or flows from the connector to the extension portion through the power terminal. As the extension portion increases a contact area for transmitting electrical power, power loss during electrical power transmission and heat generated in a circuit board in existing connector structures are reduced, thereby extending service life of the connector. A power supply having the connector is also provided.

11 Claims, 9 Drawing Sheets

(56) References Cited

U.S. PATENT DOCUMENTS

2001/0003685 A1\* 6/2001 Aritani ................ H01R 13/533
439/485
2002/0098743 A1\* 7/2002 Schell ................. H01R 13/055
439/850

\* cited by examiner

CONNECTOR HAVING INCREASED CONTACT AREA FOR POWER TRANSMISSION AND RELATED POWER SUPPLY

BACKGROUND OF THE INVENTION

1. Field of the Invention

The disclosed embodiments of the present invention relate to a power connector, and more particularly, to a blade-type connector and a power supply having the blade-type connector.

2. Description of the Prior Art

Power connectors are widely used in electronic products. A conventional power connector includes an insulating body, power terminals disposed within the insulating body and signal terminals. Welding pins of the power terminals and the signal terminals protrudes from the insulating body so as to be welded to a circuit board.

In a conventional blade-type connector 100' shown in FIG. 1 and FIG. 2, an insulating body 110' has a plurality of accommodation slots 111' spaced from each other, wherein the accommodation slots 111' extend through a rear side 112' and a bottom side of the insulating body 110'. The power terminal 120' is inserted into the accommodation slot 111', and a contact arm at the front of the power terminal 120' (not shown in FIG. 1 and FIG. 2) extends into an insertion slot at the front of the insulating body 110' so as to be electrically connected to a docking connector. A pin 121' at the bottom of the power terminal 120' protrudes from a bottom surface of the insulating body 110' so as to be welded to a circuit board. Additionally, a rear side 122' of the power terminal 120' and the rear side 112' of the insulating body 110' are at the same plane.

After the conventional connector 100' is welded to the circuit board, the current flows to the pin 121' of the power terminal 120' welded on the circuit board through traces on the circuit board, and then flows into the connector 100' through the pin 121' of the power terminal 120'. However, high current flowing through circuit board traces results in great voltage drops and power loss and causes heat problem of the circuit board, thereby shortening the service life of the connector 100'.

Thus, there is a need to provide a connector and power supply, which can reduce power loss, voltage drops and heat generated during electrical power transmission, to solve the above problems.

SUMMARY OF THE INVENTION

It is therefore one objective of the present invention to provide a connector capable of reducing power loss, voltage drops and heat generated during electrical power transmission to solve the above problems.

It is therefore another objective of the present invention to provide a power supply capable of reducing power loss, voltage drops and heat generated during electrical power transmission to solve the above problems.

To achieve the above objectives, an exemplary connector is disclosed according to an embodiment of the present invention. The exemplary connector is electrically connected to a circuit board of a power supply. The exemplary connector comprises an insulating body and a plurality of power terminal components. The power terminal components are plugged into the insulating body, wherein each of the power terminal components comprises a power terminal and an extension portion. The power terminal is inserted into the insulating body. The extension portion is protruded at a rear end of the power terminal in a projecting manner, wherein the extension portion protrudes out of the insulating body.

Preferably, a bottom of the extension portion has an extension portion pin disposed in a projecting manner, and the extension portion pin is arranged to be welded to the circuit board.

Preferably, a side of the power terminal opposite to the extension portion has a contact arm, and a bottom of the power terminal has a pin. The pin protrudes out of the insulating body, and is arranged to be welded to the circuit board. The contact arm is arranged to be electrically connected to a docking connector.

Preferably, the extension portion has a hole, the hole is arranged to connect a wire, and the wire is weld to the circuit board.

Preferably, the insulating body has a plurality of terminal slots, and each of the power terminal components is plugged into a corresponding one of the terminal slots.

In contrast to prior art connectors, each power terminal component of the proposed connector comprises a power terminal and an extension portion. The power terminal is inserted into an insulating body. The extension portion is protruded at a rear end of the power terminal in a projecting manner, wherein the extension portion protrudes out of the insulating body. During operation of the proposed connector, current flows from the extension portion to the proposed connector through the power terminal, or flows from the proposed connector to the extension portion through the power terminal. As the extension portion can increase a contact area for transmitting electrical power, the present invention can reduce power loss during electrical power transmission and heat generated in a circuit board in existing connector structures, thereby extending service life of the connector.

To achieve the above objectives, another exemplary connector is disclosed according to an embodiment of the present invention. The exemplary connector is electrically connected to a circuit board of a power supply. The exemplary connector comprises an insulating body and a plurality of power terminal components. The power terminal components are plugged into the insulating body, wherein each of the power terminal components comprises two power terminals, two extension portions and a copper track. The two power terminals are inserted into the insulating body. The two extension portions are disposed in correspondence with the two power terminals respectively, wherein each of the two extension portions is protruded at a rear end of a corresponding power terminal in a projecting manner, and the two extension portions protrude out of the insulating body. The copper track is disposed between the two extension portions, wherein the copper track is coupled to the two extension portions, and the copper track and the two extension portions are electrically connected to the circuit board jointly.

Preferably, a bottom of each of the two extension portions has an extension portion pin disposed in a projecting manner, and the extension portion pin is arranged to be welded to the circuit board.

Preferably, a front of the copper track has a copper track pin disposed in a downward projecting manner, and each of the copper track pin and the extension portion pin is welded to the circuit board.

Preferably, a side of each of the two power terminals opposite to the extension portion has a contact arm, and a bottom of each of the two power terminals has a pin. The pin protrudes out of the insulating body, and is arranged to be welded to the circuit board. The contact arm is arranged to be electrically connected to a docking connector.

Preferably, a thickness of the copper track is not greater than a distance between the two extension portions.

Preferably, the insulating body has a plurality of terminal slots, and each of the power terminal components is plugged into a corresponding one of the terminal slots.

In contrast to prior art connectors, each power terminal component of the proposed connector comprises two power terminals and two extension portions and a copper track. The two power terminals are inserted into an insulating body. The two extension portion are disposed in correspondence with the two power terminals respectively, wherein each of the two extension portions is protruded at a rear end of a corresponding power terminal in a projecting manner, and the two extension portions protrude out of the insulating body. The copper track is disposed between the two extension portions, wherein the copper track is coupled to the two extension portions, and each of the copper track and the two extension portions is electrically connected to the circuit board. During operation of the proposed connector, current flows from the copper track to the proposed connector through the power terminal, or flows from the proposed connector to the copper track through the power terminal. As the copper track can increase a contact area for transmitting electrical power, the present invention can reduce power loss during electrical power transmission and heat generated in a circuit board in existing connector structures, thereby extending service life of the connector.

Correspondingly, an exemplary power supply is disclosed according to an embodiment of the present invention. The exemplary power supply comprises a circuit board and a connector electrically connected to the circuit board, wherein the connector may be implemented by the aforementioned proposed connectors.

Preferably, the circuit board has a through hole corresponding to the copper track pin and the extension portion pin, and each of the copper track pin and the extension portion pin is welded to the circuit board through the through hole.

Correspondingly, the proposed power supply including the proposed connector has the same advantages as described above.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
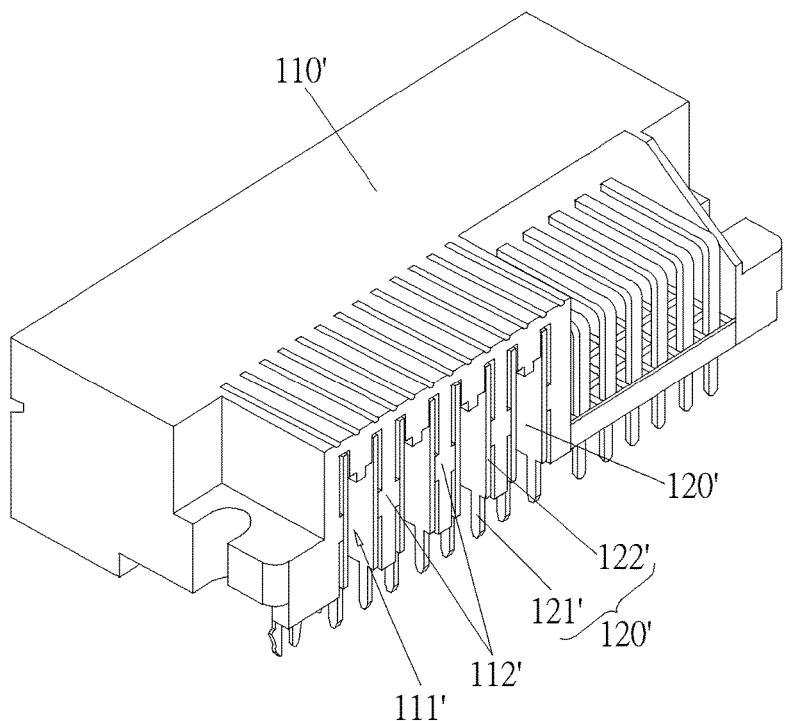
FIG. 1 is a diagram illustrating a structure of a conventional connector.
Figure 2:
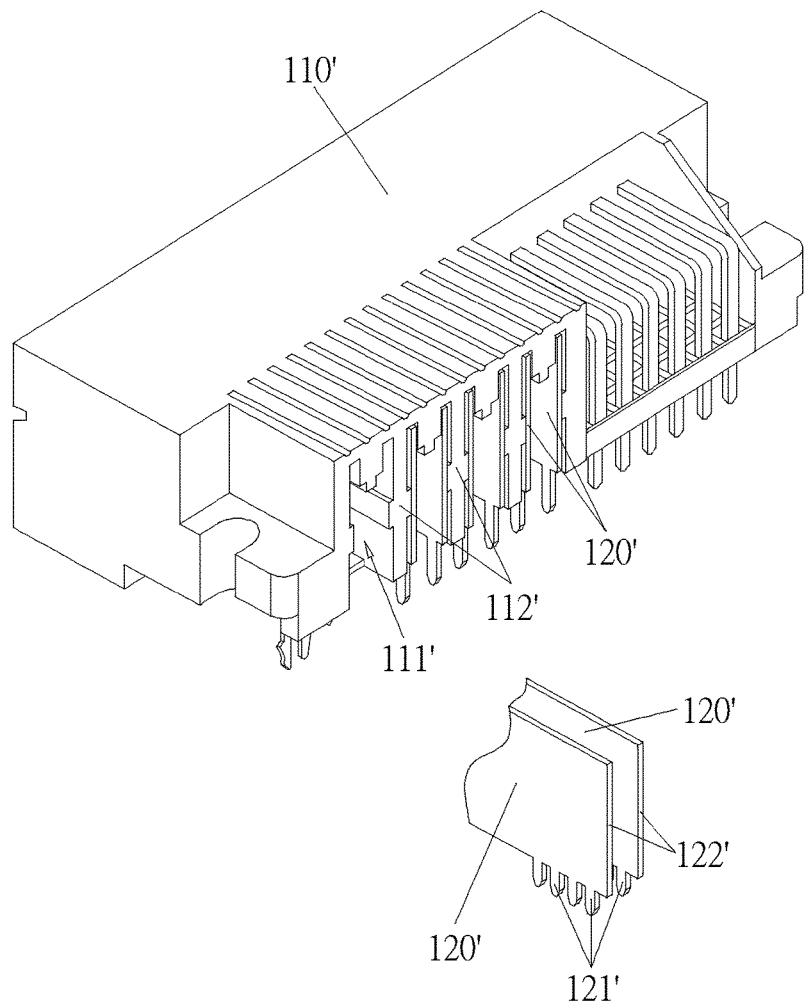
FIG. 2 is a diagram illustrating power terminals inserted into the conventional connector shown in FIG. 1.

Referring to the drawings, in which like numerals represent like elements, various aspects of the present invention will be described.

Figure 3:
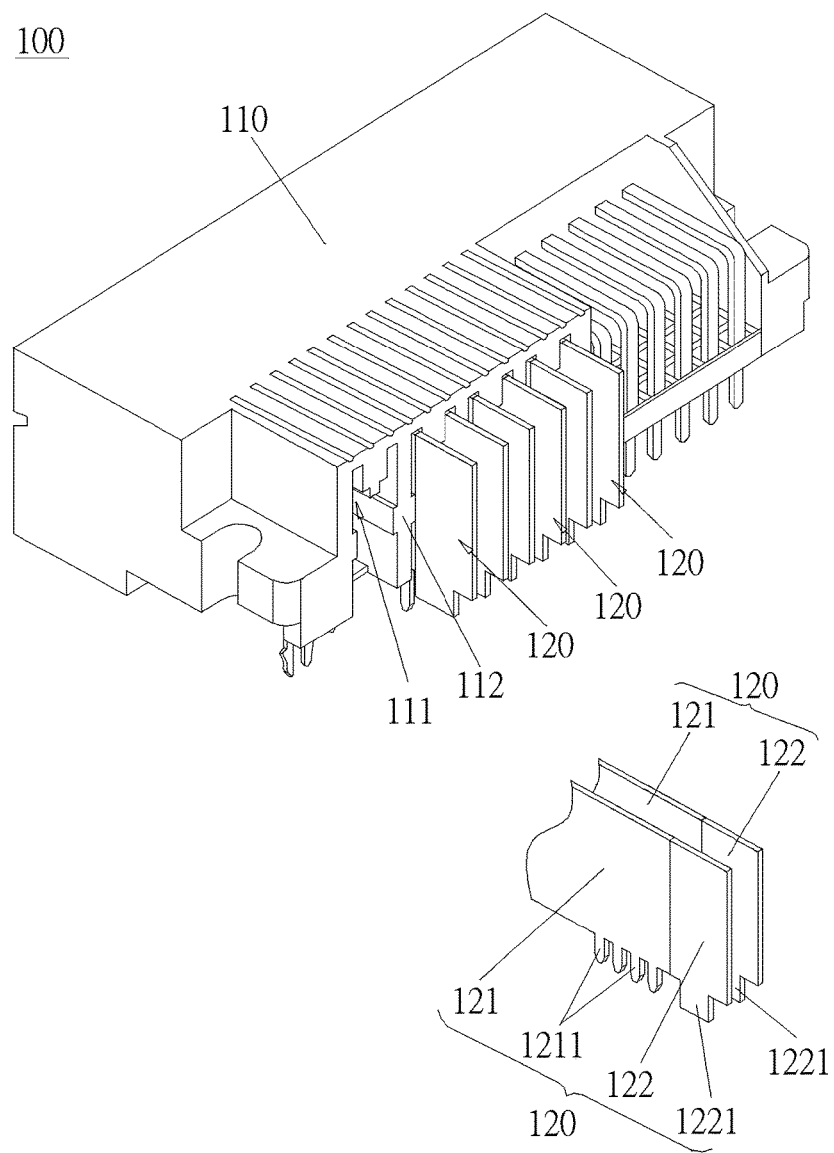
FIG. 3 is a diagram illustrating an exemplary connector according to an embodiment of the present invention.

Please refer to FIG. 3, which is a diagram illustrating an exemplary connector 100 according to an embodiment of the present invention, wherein the connector 100 is electrically connected to a circuit board (not shown in FIG. 3). As a person skilled in the art can appreciate a structure of the circuit board, the description thereof is omitted here for brevity.

In this embodiment, the connector 100 may include an insulating body 110 and a plurality of power terminal components 120, wherein the insulating body 110 may have a plurality of terminal slots 111. The number of the terminal slots 111 may correspond to the number of the power terminal components 120. Each of the terminal slots 111 extends through a rear side 112 and a bottom side of the insulating body 110. Each of the power terminal components 120 is plugged into a corresponding one of the terminal slots 111.

Specifically, each of the power terminal components 120 may include a power terminal 121 and an extension portion 122. The power terminal 121 is inserted into the corresponding terminal slot 111. The extension portion 122 is protruded at a rear end of the power terminal 121 in a projecting manner, wherein the extension portion 122 protrudes out of the insulating body 110. In addition, a bottom of the extension portion 122 has an extension portion pin 1221 disposed in a projecting manner, and the extension portion pin 1221 is arranged to be welded to the circuit board (e.g. the circuit board 200 shown in FIG. 8).

Further, a side of the power terminal 121 away from (or opposite to) the extension portion 122 has a contact arm (not shown in FIG. 3), and a bottom of the power terminal 121 has a pin 1211. After the power terminal 121 is inserted into the terminal slot 111, the pin 1211 protrudes out of the bottom side of the insulating body 110, wherein the pin 1221 is arranged to be welded to the circuit board. The contact arm extends towards the front of the insulating body 110, and is arranged to be electrically connected to a docking connector (not shown in FIG. 3).

It should be noted that a one-to-one correspondence between the power terminal 121 and the extension portion 122 in this embodiment is for illustrative purposes only. In other embodiments, it is possible to couple multiple extension portions 122 together in response to the required number of electric potentials. For example, respective tops of two extension portions 122 corresponding to two power terminals 121 may extend to be connected in an upside down U-shaped such that the two extension portions 122 may output the same electric potential.

Figure 4:
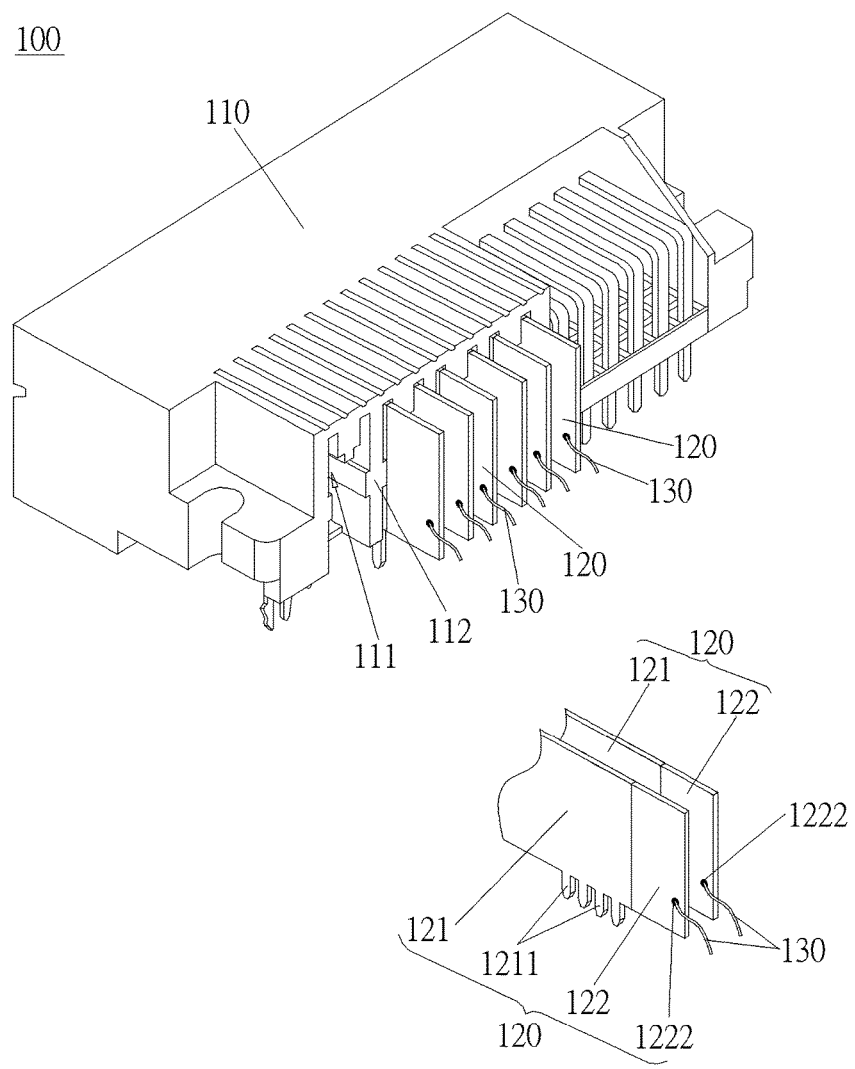
FIG. 4 is a diagram illustrating an exemplary connector according to another embodiment of the present invention.

Please refer to FIG. 4, which is a diagram illustrating an exemplary connector 100 according to another embodiment of the present invention. The main difference between the exemplary connector shown in FIG. 3 and the exemplary connector shown in FIG. 4 is the structure of power terminal components. Accordingly, the following description focuses primarily upon structure and features that are different than the embodiments described above.

In this embodiment, each of the power terminal components 120 may include a power terminal 121 and an extension portion 122, wherein the power terminal 121 is inserted into a corresponding terminal slot 111 of the insulating body 110, and the extension portion 122 is protruded at a rear end of the power terminal 121 in a projecting manner. In addition, the extension portion 122 protrudes out of the insulating body 110, and is arranged to be coupled to the circuit board.

A side of the power terminal 121 away from (or opposite to) the extension portion 122 has a contact arm (not shown in FIG. 3), and a bottom of the power terminal 121 has a pin 1211. After the power terminal 121 is inserted into the terminal slot 111, the pin 1211 protrudes out of the bottom side of the insulating body 110, wherein the pin 1221 is arranged to be welded to the circuit board. The contact arm extends towards the front of the insulating body 110, and is arranged to be electrically connected to a docking connector (not shown in FIG. 3).

In this embodiment, the extension portion 122 may have a hole 1222, the hole 1222 is arranged to connect a wire 130, and the wire 130 is weld to the circuit board.

It can be appreciated that a one-to-one correspondence between the power terminal 121 and the extension portion 122 in this embodiment is for illustrative purposes only and is not meant to be a limitation of the present invention. It is possible to couple multiple extension portions 122 together in response to the required number of electric potentials.

In accordance with the embodiments shown in FIG. 3 and FIG. 4, each of the power terminal components 120 of the proposed connector 100 may include a power terminal 121 and an extension portion 122. The extension portion 122 is protruded at a rear end of the power terminal 121 in a projecting manner, the power terminal 121 is inserted into the insulating body 110, and the extension portion 122 protrudes out of the insulating body 110. During operation of the connector 100, current may firstly flow from the extension portion 122 to the power terminal 121, and then flow from the power terminal 121 to the connector 100 in this embodiment. In other embodiments, the current may firstly flow from the connector 100 to the power terminal 121, and then flow from the power terminal 121 to the extension portion 122. As the extension portion 122 can increase a contact area for transmitting electrical power, the present invention can reduce power loss during electrical power transmission and heat generated in the circuit board in the structure of the connector 100, thereby extending service life of the connector 100.

Next, as shown in FIGS. 5-8, another exemplary connector 100 is provided according to an embodiment of the present invention, wherein the connector 100 is electrically connected to the circuit board 200. As a person skilled in the art can appreciate a structure of the circuit board 200, the description thereof is omitted here for brevity. The following description focuses primarily upon structure and features of the connector 100.

Figure 5:
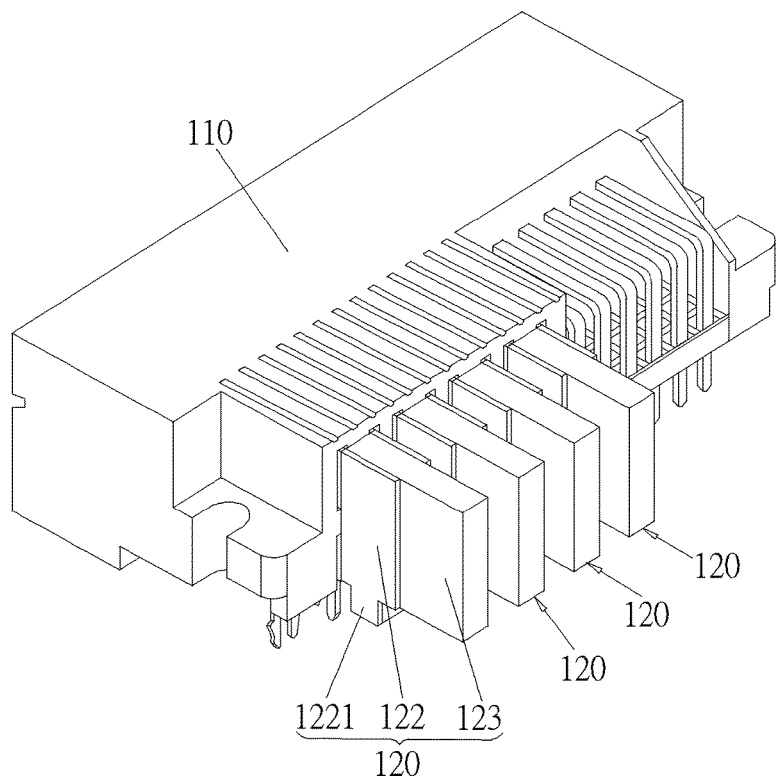
FIG. 5 is a diagram illustrating an exemplary connector according to still another embodiment of the present invention.
Figure 6:
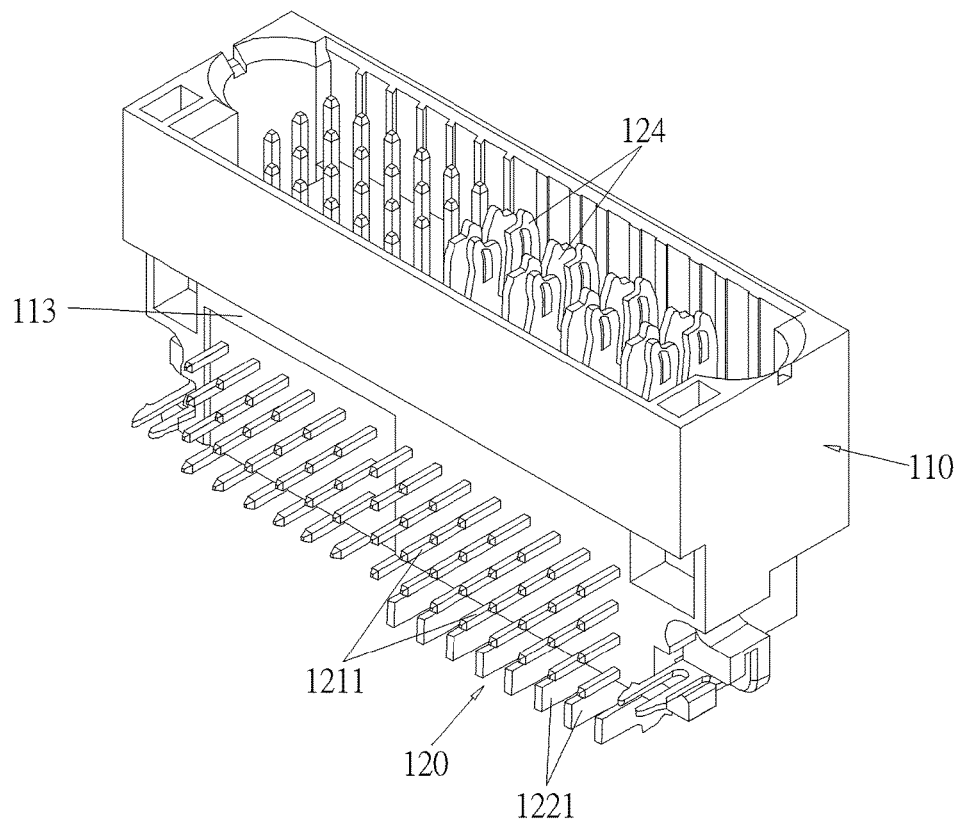
FIG. 6 is a diagram illustrating a different view of the connector shown in FIG. 5 according to an embodiment of the present invention.
Figure 7:
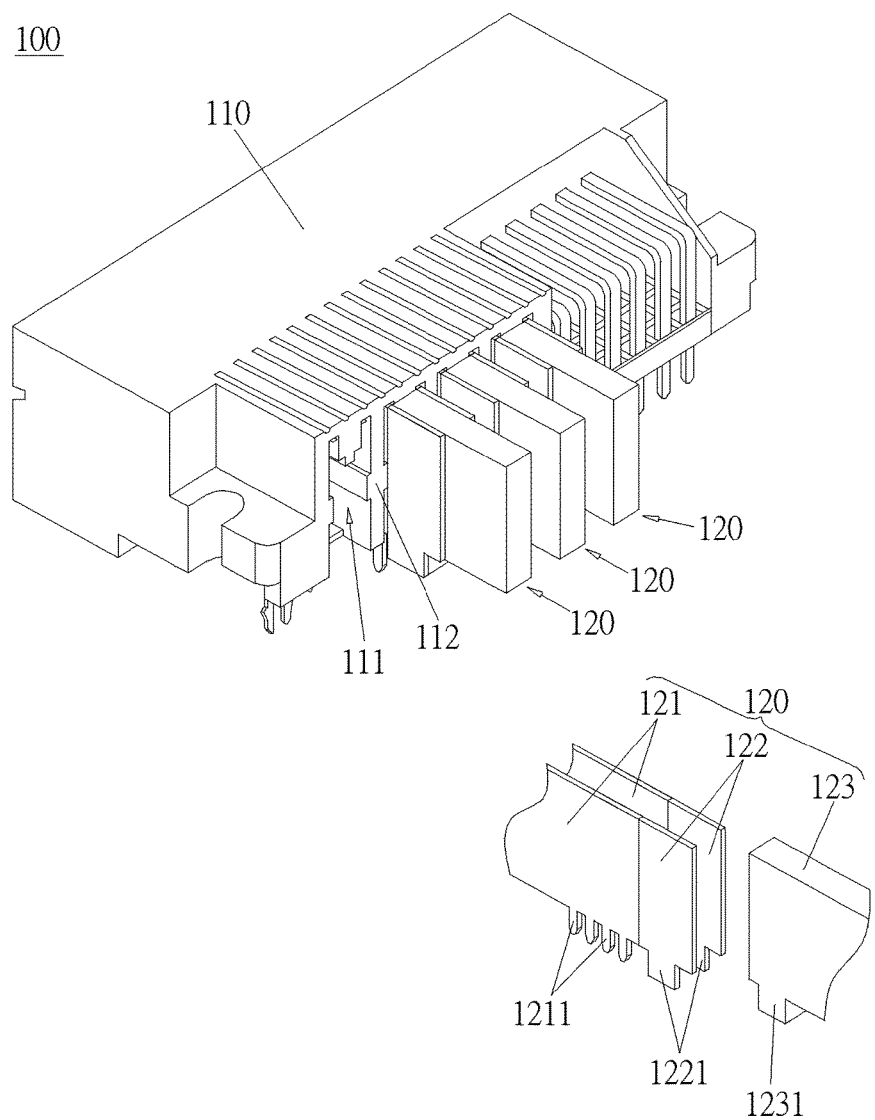
FIG. 7 is a diagram illustrating exemplary power terminal components plugged into the connector shown in FIG. 5 according to an embodiment of the present invention.

Please refer to FIGS. 5-7. The connector 100 may include an insulating body 110 and a plurality of power terminal components 120, wherein the insulating body 110 may have a plurality of terminal slots 111, and the number of the terminal slots 111 may correspond to the number of the power terminal components 120. Each of the terminal slots 111 extends through a rear side 112 and a bottom side 113 of the insulating body 110. Each of the power terminal components 120 is plugged into a corresponding one of the terminal slots 111.

Specifically, each of the power terminal components 120 may include two power terminals 121, two extension portions 122 and a copper track 123. The two extension portions 122 are disposed in correspondence with the two power terminals 121 respectively, wherein each of the two extension portions 122 is protruded at a rear end of a corresponding power terminal 121 in a projecting manner. The copper track 123 is coupled to the two extension portions 122, wherein the copper track 123 may be fixedly or detachably connected to the two extension portions 122. After the power terminal 121 is inserted into the corresponding terminal slot 111, the two extension portions 122 and the copper track 123 protrude out of the rear side 112 of the insulating body 110, and each of the copper track 123 and the two extension portions 122 is electrically connected to the circuit board 200. Additionally, the bottom of the power terminal 121 protrudes out of the bottom side 113 of the insulating body 110 so as to be welded to the circuit board 200, and the front of the power terminal 121 extends into a connector port so as to be electrically connected to a docking connector.

A side of the power terminal 121 away from (or opposite to) the extension portion 122 has a contact arm 124, and the bottom of the power terminal 121 has a pin 1211. After the power terminal 121 is inserted into the terminal slot 111, the pin 1211 protrudes out of the bottom side 113 of the insulating body 110, wherein the pin 1221 is arranged to be welded to the circuit board 200. The contact arm 124 extends towards the front of the insulating body 110, and is arranged to be electrically connected to the docking connector.

In this embodiment, the copper track 123 is disposed between the two extension portions 122, and is welded to the two extension portions 122. Hence, a thickness of the copper track 123 may be not greater than a distance between the two extension portions 122. Preferably, the thickness of the copper track 123 may correspond to the distance between the two extension portions 122.

Figure 8:
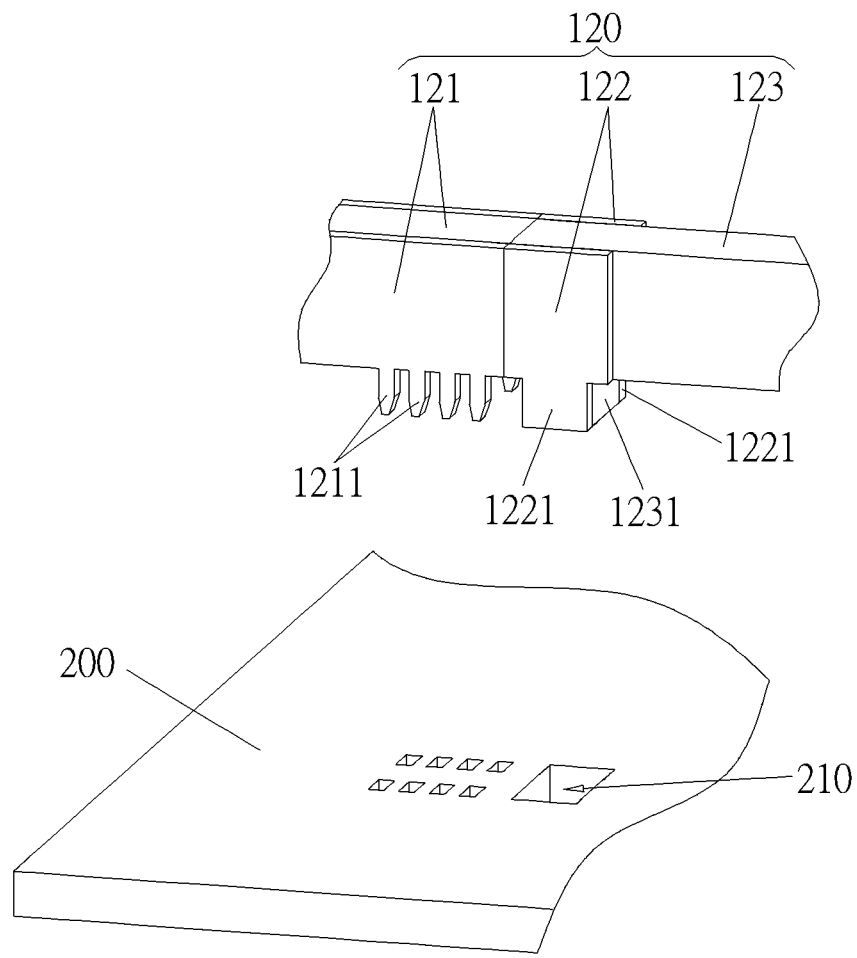
FIG. 8 is a diagram illustrating exemplary connection between the power terminal component shown in FIG. 7 and a circuit board according to an embodiment of the present invention.

More specifically, a bottom of each of the two extension portions 122 may have an extension portion pin 1221 disposed in a projecting manner. A front of the copper track 123 may have a copper track pin 1231 disposed in a downward projecting manner. After the connector 100 is connected to the circuit board 200, the front of the copper track 123 is welded between the two extension portions 122 such that the copper track pin 1231 corresponds to the extension portion pin 1221 (as shown in FIG. 8), wherein each of the copper track pin 1231 and the extension portion pin 1221 is welded to the circuit board 200 jointly.

Please refer to FIG. 8 again. The circuit board 200 may have a through hole 210 corresponding to the copper track pin 1231 and the extension portion pin 1221, and each of the copper track pin 1231 and the extension portion pin 1221 may be welded to the circuit board 200 through the through hole 210.

It should be noted that the copper track 123 is coupled/connected to only two extension portions 122 in this embodiment. This is for illustrative purposes only and is not meant to be a limitation of the present invention. In other embodiments, it is possible to couple the copper track 123 to multiple extension portions 122 in response to the required number of electric potentials, such that each of the multiple extension portions 122 may output the same electric potential. Furthermore, in accordance with the embodiment where one copper track 123 is coupled to two extension portions 122, the connector 100 may output four different electric potentials such as GND (0V), 3.3V, 5V and 12V. In other embodiments, it is possible to couple one copper track 123 to four extension portions 122 such that the proposed connector may output only two different electric potentials such as GND (0V) and 12V. Instill other embodiments, it is possible to couple one copper track 123 to one extension portion 122 such that more than four different electric potentials may be outputted.

In accordance with the embodiments shown in FIGS. 5-8, after the connector 100 is connected to the circuit board 200, current may firstly flow from the copper track 123 to the power terminal 121, and then flow from the power terminal 121 into the connector 100. In a case where the proposed connector 100 is applied to high current conduction, in contrast to prior art structures which utilize traces on the circuit board 200 to transmit high current, the proposed connector 100 may utilize the copper track 123 to increase a contact area for transmitting electrical power even further, thereby reducing power loss during electrical power transmission and heat generated in the circuit board 200.

In accordance with the embodiments shown in FIGS. 5-8, each of the power terminal components 120 of the proposed connector 100 may include two power terminals 121 and two extension portions 122 and a copper track 123. The two extension portion 122 are disposed in correspondence with the two power terminals 121 respectively, wherein each of the two extension portions 122 is protruded at a rear end of a corresponding power terminal 121 in a projecting manner. The copper track 123 is coupled to the two extension portions 122. The two power terminals 121 are inserted into the insulating body 110. Each of the two extension portions 122 and the copper track 123 protrudes out of the insulating body 110, and is electrically connected to the circuit board 200. During operation of the proposed connector 100, current may flow from the copper track 123 to the power terminal 121, and then flow from the power terminal 121 into the proposed connector 100 in one embodiment. In other embodiments, current may flow from the proposed connector 100 to the power terminal 121, and then flow the power terminal 121 to the copper track 123. As the copper track 123 can increase a contact area for transmitting electrical power even further, the present invention can reduce power loss during electrical power transmission and heat generated in the circuit board 200 in the structure of the connector 100, thereby extending service life of the connector 100.

As a person skilled in the art can readily understand structures of other elements of the connector 100, further description is omitted here for brevity.

Figure 9:
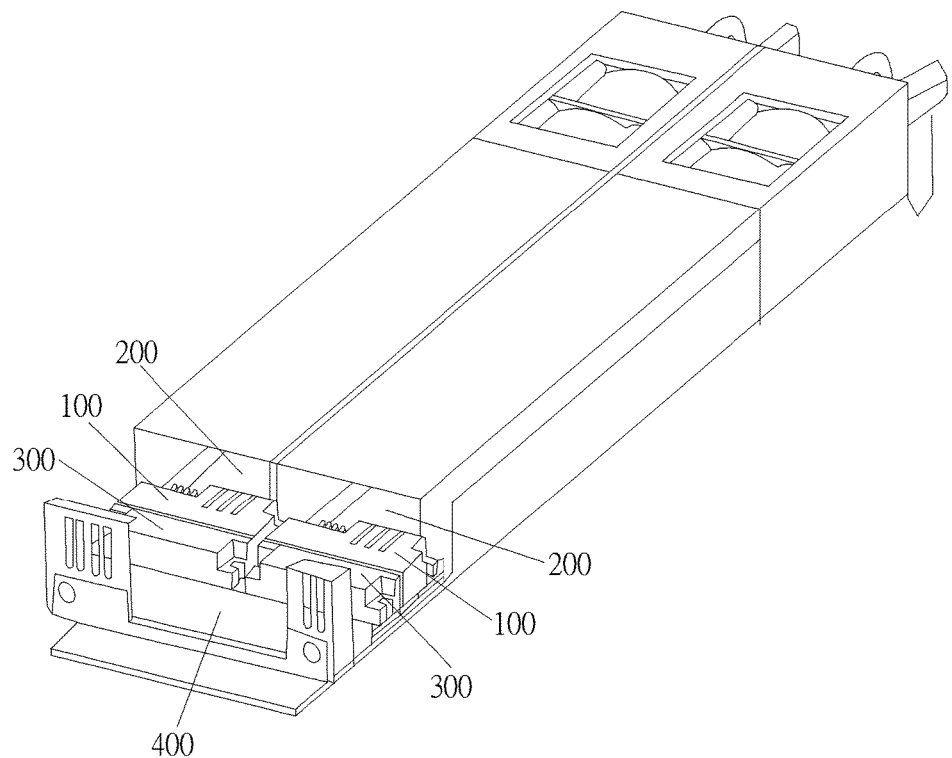
FIG. 9 is a diagram illustrating an exemplary power supply including the connector shown in any one of FIGS. 3-7 according to an embodiment of the present invention.

Please refer to FIG. 9, which is a diagram illustrating an exemplary redundant power supply including the connector 100 shown in any one of FIGS. 3-7 according to an embodiment of the present invention. FIG. 9 illustrates two redundant powers disposed next to each other, wherein each redundant power supply may include the connector 100 and a docking connector 300 which are mutually plugged. The docking connector 300 is electrically connected to a backplane printed circuit board (PCB) 400. After transmitting current to the docking connector 300, the connector 100 may utilize the docking connector 300 to output electrical power to the backplane PCB 400. As the redundant power supply includes the proposed connector 100, the redundant power supply may have the same advantages as described above.

In addition, as a person skilled in the art can readily understand structures of other elements of the redundant power supply, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A connector electrically connected to a circuit board of a power supply, the connector comprising:
   an insulating body; and
   a plurality of power terminal components, plugged into the insulating body, wherein each of the power terminal components comprises:
   a power terminal, inserted into the insulating body; and
   an extension portion, protruded at a rear end of the power terminal in a projecting manner, wherein a bottom of the extension portion has an extension portion pin disposed in a projecting manner, the extension portion pin is arranged to be welded to the circuit board, the extension portion protrudes out the insulating body, the extension portion has a hole, the hole is arranged to connect a wire, and the wire is welded to the circuit board and the extension portion is for providing a power transmission path and heat dissipation for the circuit board.

2. The connector of claim 1, wherein a side of the power terminal opposite to the extension portion has a contact arm, and a bottom of the power terminal has a pin; the pin protrudes out of the insulating body, and is arranged to be welded to the circuit board; and the contact arm is arranged to be electrically connected to a docking connector.

3. The connector of claim 1, wherein the insulating body has a plurality of terminal slots, and each of the power terminal components is plugged into a corresponding one of the terminal slots.

4. A connector electrically connected to a circuit board of a power supply, the connector comprising:
   an insulating body; and
   a plurality of power terminal components, plugged into the insulating body, wherein each of the power terminal components comprises:
   two power terminals, inserted into the insulating body;
   two extension portions, disposed in correspondence with the two power terminals respectively, wherein each of the two extension portions is protruded at a rear end of a corresponding power terminal in a projecting manner, and the two extension portions protrude out of the insulating body; and
   a copper track, disposed between the two extension portions, wherein the copper track is coupled to the two extension portions, and the copper track and the two extension portions are electrically connected to the circuit board jointly.

5. The connector of claim 4, wherein a bottom of each of the two extension portions has an extension portion pin disposed in a projecting manner, and the extension portion pin is arranged to be welded to the circuit board.

6. The connector of claim 5, wherein a front of the copper track has a copper track pin disposed in a downward projecting manner, and each of the copper track pin and the extension portion pin is welded to the circuit board.

7. The connector of claim 4, wherein a side of each of the two power terminals opposite to the extension portion has a contact arm, and a bottom of each of the two power terminals has a pin; the pin protrudes out of the insulating body, and is arranged to be welded to the circuit board; and the contact arm is arranged to be electrically connected to a docking connector.

8. The connector of claim 4, wherein a thickness of the copper track is not greater than a distance between the two extension portions.

9. The connector of claim 4, wherein the insulating body has a plurality of terminal slots, and each of the power terminal components is plugged into a corresponding one of the terminal slots.

10. A power supply, comprising:
a circuit board; and
a connector, electrically connected to the circuit board, the connector comprising:
an insulating body; and
a plurality of power terminal components, plugged into the insulating body, wherein each of the power terminal components comprises:
a power terminal, inserted into the insulating body;
an extension portion, protruded at a rear end of the power terminal in a projecting manner, wherein the extension portion protrudes out of the insulating body; and
a copper track, coupled to the extension portion, wherein the copper track protrudes out of the insulating body.

11. The power supply of claim 10, wherein a bottom of the extension portion has an extension portion pin disposed in a projecting manner; a front side of the copper track has a copper track pin disposed in a downward projecting manner; and the circuit board has a through hole corresponding to the copper track pin and the extension portion pin, and the copper track pin and the extension portion pin are welded jointly to the circuit board through the through hole.

* * * * *